(12) United States Patent
Kawakita et al.

(10) Patent No.: US 9,812,385 B2
(45) Date of Patent: Nov. 7, 2017

(54) ELECTRONIC COMPONENT PACKAGE INCLUDING ELECTRONIC COMPONENT, METAL MEMBER, AND SEALING RESIN

(71) Applicant: Panasonic Intellectual Property Management Co., Ltd., Osaka (JP)

(72) Inventors: Koji Kawakita, Nara (JP); Takashi Ichiryu, Osaka (JP); Masanori Nomura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/157,466

(22) Filed: May 18, 2016

(65) Prior Publication Data

US 2016/0351481 A1 Dec. 1, 2016

(30) Foreign Application Priority Data

May 25, 2015 (JP) .................................. 2015-105759

(51) Int. Cl.
*H01L 23/49* (2006.01)
*H01L 23/31* (2006.01)
(Continued)

(52) U.S. Cl.
CPC .... *H01L 23/49582* (2013.01); *H01L 21/4821* (2013.01); *H01L 23/4334* (2013.01);
(Continued)

(58) Field of Classification Search
CPC ........... H01L 23/49572; H01L 23/3114; H01L 23/49568
See application file for complete search history.

(56) References Cited

U.S. PATENT DOCUMENTS 6,670,696 B2 * 12/2003 Toyosawa ......... H01L 23/49572
257/667
7,227,256 B2 * 6/2007 Zhao ................... H01L 23/3677
257/707

(Continued)

FOREIGN PATENT DOCUMENTS

JP 2002-134653 5/2002
JP 2003-188312 7/2003
(Continued)

*Primary Examiner* — Ida M Soward
(74) *Attorney, Agent, or Firm* — McDermott Will & Emery LLP

(57) ABSTRACT

An electronic component package according to one aspect of the present disclosure includes a metal pattern layer having a first principal surface and a second principal surface, an electronic component disposed on the first principal surface and electrically connected to the metal pattern layer, at least one metal member disposed on the first principal surface and electrically connected to the metal pattern layer, a sealing resin layer disposed on the first principal surface, the electronic component and the at least one metal member, and an insulating layer disposed on the second principal surface. The at least one metal member is thicker than the electronic component. In plan view, the at least one metal member is disposed on an area of the first principal surface, the area including an end of the first principal surface. The at least a part of the metal pattern layer is exposed from the insulating layer.

9 Claims, 13 Drawing Sheets

(51) Int. Cl.
*H01L 23/495* (2006.01)
*H01L 23/433* (2006.01)
*H01L 23/00* (2006.01)
*H01L 21/48* (2006.01)
*H01L 21/56* (2006.01)

(52) U.S. Cl.
CPC ........ *H01L 23/49558* (2013.01); *H01L 24/19* (2013.01); *H01L 24/20* (2013.01); *H01L 24/96* (2013.01); *H01L 24/97* (2013.01); *H01L 21/568* (2013.01); *H01L 23/3128* (2013.01); *H01L 2224/04105* (2013.01); *H01L 2224/12105* (2013.01); *H01L 2924/12041* (2013.01); *H01L 2924/13091* (2013.01); *H01L 2924/14* (2013.01); *H01L 2924/181* (2013.01); *H01L 2924/19041* (2013.01); *H01L 2924/19043* (2013.01); *H01L 2924/19105* (2013.01)

(56) References Cited

U.S. PATENT DOCUMENTS

| | | | | |
|---|---|---|---|---|
| 7,372,146 | B2* | 5/2008 | Sato | H01L 23/4334 257/675 |
| 7,436,061 | B2* | 10/2008 | Nakayama | H01L 23/3114 257/730 |
| 7,911,047 | B2* | 3/2011 | Hasegawa | H01L 23/043 257/678 |
| 8,269,335 | B2* | 9/2012 | Osumi | H01L 23/49811 257/693 |
| 8,410,614 | B2* | 4/2013 | Kunimoto | H01L 23/5389 257/685 |
| 9,209,053 | B2* | 12/2015 | Goto | H01L 21/673 |
| 2006/0183269 | A1 | 8/2006 | Fuergut et al. | |
| 2007/0267136 | A1 | 11/2007 | Tuominen et al. | |
| 2009/0160043 | A1 | 6/2009 | Shen et al. | |
| 2009/0174081 | A1* | 7/2009 | Furuta | H01L 23/49838 257/777 |
| 2010/0225202 | A1* | 9/2010 | Fukano | H03H 9/059 310/313 C |
| 2010/0276800 | A1* | 11/2010 | Yanase | H01L 21/4832 257/737 |
| 2011/0024904 | A1* | 2/2011 | Egawa | H01L 21/568 257/738 |
| 2011/0155433 | A1* | 6/2011 | Funaya | H01L 23/49827 174/258 |
| 2013/0001767 | A1* | 1/2013 | Kajiki | H01L 23/3128 257/734 |
| 2013/0026650 | A1* | 1/2013 | Yamagata | H01L 24/24 257/774 |
| 2013/0069245 | A1* | 3/2013 | Uchiyama | H01L 24/24 257/774 |
| 2013/0241040 | A1 | 9/2013 | Tojo et al. | |
| 2014/0153238 | A1* | 6/2014 | Nishimura | H01L 25/0753 362/237 |
| 2015/0076545 | A1 | 3/2015 | Nakatani et al. | |
| 2015/0206819 | A1 | 7/2015 | Ichiryu et al. | |
| 2015/0214129 | A1 | 7/2015 | Kawakita et al. | |
| 2015/0221842 | A1 | 8/2015 | Mima et al. | |
| 2015/0228619 | A1 | 8/2015 | Sawada et al. | |
| 2015/0236233 | A1 | 8/2015 | Yamashita et al. | |
| 2015/0279759 | A1* | 10/2015 | Miyakoshi | H01L 24/17 257/738 |
| 2016/0148861 | A1* | 5/2016 | Liang | H01L 23/49517 257/676 |
| 2016/0351482 | A1* | 12/2016 | Zhang | H01L 23/49517 |
| 2016/0372338 | A1* | 12/2016 | Liang | H01L 21/4871 |

FOREIGN PATENT DOCUMENTS

| | | |
|---|---|---|
| JP | 2008-522396 | 6/2008 |
| JP | 2009-277954 | 11/2009 |
| JP | 2013-110213 | 6/2013 |
| JP | 2013-219324 | 10/2013 |
| WO | 2014/034024 | 3/2014 |
| WO | 2014/097641 | 6/2014 |
| WO | 2014/097642 | 6/2014 |
| WO | 2014/097643 | 6/2014 |
| WO | 2014/097644 | 6/2014 |
| WO | 2014/097645 | 6/2014 |

* cited by examiner

ELECTRONIC COMPONENT PACKAGE INCLUDING ELECTRONIC COMPONENT, METAL MEMBER, AND SEALING RESIN

BACKGROUND

1. Technical Field

The present disclosure relates to an electronic component package, and a method for manufacturing the electronic component package.

2. Description of the Related Art

Advances in electronic devices have led to development of various packaging techniques in the field of electronics. Some existing packaging techniques for electronic components such as ICs and inductors employ a circuit board or a lead frame. That is, common existing forms of electronic component packages include a "package using a circuit board" and a "package using a lead frame".

As illustrated in FIG. 12A, a "package using a circuit board" includes electronic components such as an inductor 500, a controller IC 502, an LSI 504, and an MLC 506 that are mounted on a circuit board. Common existing types of such a package include "wire bonding type (W/B type)" and "flip-chip type (F/C type)". In contrast, a "lead frame type" package includes a lead frame with leads and die pads as illustrated in FIG. 12B. These related art techniques are disclosed in, for example, U.S. Pat. Nos. 7,927,922, and 7,202,107, Japanese Unexamined Patent Application Publication (Translation of PCT Application) No. 2008-522396, and Japanese Patent No. 5521130.

SUMMARY

In one general aspect, the techniques described here feature an electronic component package including a metal pattern layer having a first principal surface, and a second principal surface opposite to the first principal surface, an electronic component that is disposed on the first principal surface, and electrically connected to the metal pattern layer, at least one metal member that is disposed on the first principal surface, and electrically connected to the metal pattern layer, a sealing resin layer disposed on the first principal surface, the electronic component, and the at least one metal member, and an insulating layer disposed on the second principal surface. The at least one metal member has a thickness greater than a thickness of the electronic component. In plan view, the at least one metal member is disposed on an area of the first principal surface, the area including an end of the first principal surface. At least a part of the metal pattern layer is exposed from the insulating layer, the part located in an area below the at least one metal member.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

The inventors have found out that the existing packaging techniques have problems or room for improvement as discussed below, and thus have arrived at an electronic component package and a method for manufacturing the electronic component package according to the present disclosure.

Figure 12A:
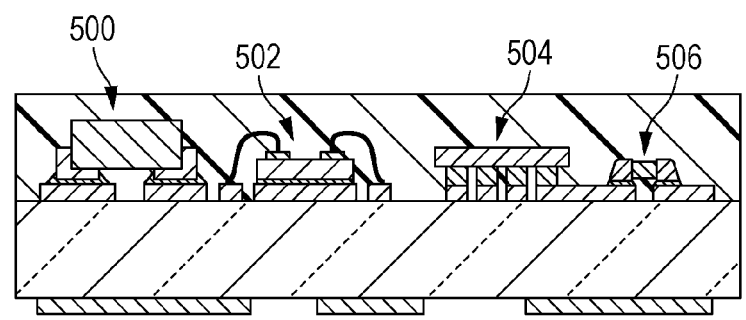
FIG. 12A is a cross-sectional view schematically illustrating the configuration of an electronic component package using a circuit board according to related art.
Figure 12B:
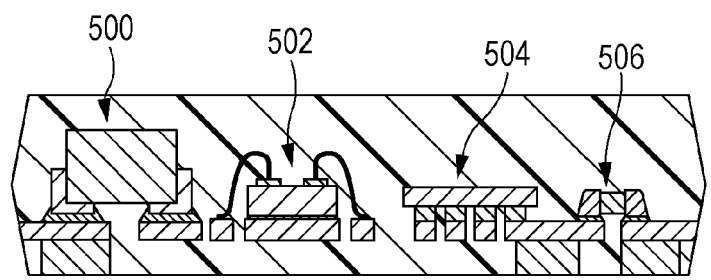
FIG. 12B is a cross-sectional view schematically illustrating the configuration of an electronic component package using a lead frame according to related art.

With regard to the various types of packages mentioned in the "Description of the Related Art" section, although the "package using a circuit board" (see FIG. 12A) enables high package density, the use of a circuit board leaves problems in terms of heat dissipation. Moreover, the cost of such a board itself is not negligible, and thus this type of package is not necessarily a satisfactory solution in terms of cost. The cost involved with wire bonding or flip-chip packaging is also not negligible, leading to demands for further cost reduction. For example, flip-chip packaging requires an expensive mounter. As for the "lead frame type" (see FIG. 12B) packages, the use of a lead frame makes fine machining difficult, making such packages unsuitable for high package density applications.

Directing attention to issues such as second-level packaging of a package, existing techniques have been also found to have room for improvement in terms of melting of solder. Specifically, existing techniques leave room for improvement in terms of the characteristics of heating applied in mounting the package on a second-level substrate. In particular, during solder connection of the package to the second-level substrate, for example, during reflow soldering, thermal capacity characteristics of components included in the package often introduce localized differences in the melting of solder, making it difficult to achieve a desired solder connection.

For example, consider a case where a "package with a metal layer formed directly on each electronic component or other components" is to be mounted and connected to the second-level substrate. In this case, thermal capacity characteristics possessed by such a metal layer itself may impede uniform dispersion of heat across the entire package during the heating process, with the result that the solder near the central portion of the package does not melt easily. In other words, if a package includes a component with a large thermal capacity and a component with a small thermal capacity, this leads to differences in the melting of solder during the mounting on the second-level substrate. Accordingly, a further improvement is desired in terms of the reliability of solder connections.

The present disclosure includes an electronic component package, and a method for manufacturing the electronic component package as defined in the items below.

[Item 1]

An electronic component package including:
a metal pattern layer having a first principal surface, and a second principal surface opposite to the first principal surface;
an electronic component that is disposed on the first principal surface, and electrically connected to the metal pattern layer;
at least one metal member that is disposed on the first principal surface, and electrically connected to the metal pattern layer;
a sealing resin layer disposed on the first principal surface, the electronic component, and the at least one metal member; and
an insulating layer disposed on the second principal surface,
wherein the at least one metal member has a thickness greater than a thickness of the electronic component,
wherein in plan view, the at least one metal member is disposed on an area of the first principal surface, the area including an end of the first principal surface, and
wherein at least a part of the metal pattern layer is exposed from the insulating layer, the part located in an area below the at least one metal member. In the electronic component package according to Item 1, in plan view, the at least one metal member may be disposed only on an area of the first principal surface, the area including an end of the first principal surface.

[Item 2]

The electronic component package according to Item 1, wherein the thickness of the at least one metal member is not less than 50% and not more than 90% of a thickness of the sealing resin layer.

[Item 3]

The electronic component package according to Item 1 or 2, wherein the at least one metal member has a side face that is exposed from an end face of the sealing resin layer.

[Item 4]

The electronic component package according to Item 3, wherein the side face of the at least one metal member and the end face of the sealing resin layer are flush with each other.

[Item 5]

The electronic component package according to any one of Items 1 to 4,
wherein the at least one metal member comprises a first metal member and a second metal member,
wherein in plan view, the first metal member is disposed on a first area of the first principal surface, the first area including a first end of the first principal surface, and
wherein in plan view, the second metal member is disposed on a second area of the first principal surface, the second area including a second t end of the first principal surface.

[Item 6]

The electronic component package according to Item 5, wherein in plan view, the first metal member and the second metal member are disposed apart from each other.

[Item 7]

The electronic component package according to any one of Items 1 to 4, wherein the at least one metal member has a shape of a rectangular parallelepiped or a cube.

In this case, the sides or corners of the rectangular parallelepiped or the cube may be rounded.

[Item 8]

The electronic component package according to any one of Items 1 to 7, wherein the metal pattern layer includes a first metal layer and a second metal layer.

[Item 9]

The electronic component package according to any one of Items 1 to 8, wherein the insulating layer is a solder resist layer.

[Item 10]

A method for manufacturing an electronic component package, including:

(i) attaching an electronic component and at least one metal member onto an adhesive carrier;

(ii) forming a sealing resin layer on the adhesive carrier to obtain an electronic component package precursor, the sealing resin layer being formed such that the sealing resin layer covers the electronic component and the at least one metal member;

(iii) peeling off the adhesive carrier from the electronic component package precursor to expose the electronic component and the at least one metal member from a surface of the sealing resin layer;

(iv) forming a metal layer on the surface of the sealing resin layer; and (v) performing dicing such that the at least one metal member is split, wherein the at least one metal member has a thickness greater than a thickness of the electronic component.

[Item 11]

The method for manufacturing an electronic component package according to Item 10, wherein in the step (i), the electronic component and the at least one metal member are disposed on the adhesive carrier such that the electronic component is positioned inward relative to the at least one metal member.

[Item 12]

The method for manufacturing an electronic component package according to Item 10 or 11, wherein the at least one metal member comprises metal members, and wherein in the step (i), the metal members are coupled to a frame-like member.

[Item 13]

The method for manufacturing an electronic component package according to Item 12, wherein the metal members and the frame-like member are coupled to each other such that the metal members are positioned inward of an outer edge of the frame-like member.

[Item 14]

The method for manufacturing an electronic component package according to Item 12 or 13, wherein each of the metal members has a shape of a rectangular parallelepiped or a cube.

[Item 15]

The method for manufacturing an electronic component package according to Item 13, wherein the dicing is performed at a position that is inside the outer edge of the frame-like member and at which each of the metal members is to be split.

[Item 16]

The method for manufacturing an electronic component package according to any one of Items 10 to 15, wherein in the step (iv), the metal layer is formed by performing wet plating after performing dry plating.

[Item 17]

The method for manufacturing an electronic component package according to any one of Items 9 to 11, wherein the at least one metal member used in the step (i) has a thickness that is not less than 50% and not more than 90% of a thickness of the sealing resin layer.

An aspect of the present disclosure as described above makes it possible to accomplish desirable heat dissipation characteristics and high package density, and achieve packaging at low cost. Further, the reliability of connections made during the second-level packaging of the package can be also improved.

As for "heat dissipation characteristics", the packaging process according to an aspect of the present disclosure uses no wire bonding or bumps. That is, the package is of a wire-bonding-less, bump-less type, thus allowing for efficient dissipation of heat through the metal-plating pattern layer.

In one aspect of the present disclosure, fine machining can be performed for the metal layer or the metal pattern layer. The ability to perform fine machining positively contributes to high package density.

Furthermore, the package according to an aspect of the present disclosure has a "substrate-less structure". As the name implies, such a "substrate-less" package uses no substrate, which contributes to a corresponding reduction in manufacturing cost. Further, the substrate-less structure allows for a simple packaging process in comparison with processes such as wire bonding and flip-chip packaging. Such a simple packaging process can also contribute to cost reductions.

Further, an aspect of the present disclosure also positively contributes to providing a packaging technique that allows for a more favorable second-level packaging process. Specifically, during the solder connection of the package to the second-level substrate, for example, during reflow soldering, "localized differences in the melting of solder due to factors such as thermal capacity characteristics of components included in the package" are reduced, allowing a desired solder connection to be readily accomplished. That is, solder can be melted in a more uniform manner in the second-level packaging process, thus allowing for an improvement in terms of the transient heat characteristics and the ease of solder mounting in the second-level packaging process. In one illustrative example, for second-level packaging of a package including a relatively thick metal pattern layer with a solder connection made in the peripheral portion of the package, the transient heat (the heat in the second-level packaging process) is transmitted to the solder joint in the peripheral portion of the package in a more uniform manner, thus enabling a desired solder connection.

An electronic component package and a method for manufacturing the electronic component package according to an aspect of the present disclosure will be hereinafter described in more detail. It is to be noted that various elements depicted in the drawings are only schematic representations intended to facilitate understanding of the present disclosure, and the ratios between the dimensions and appearances of these elements can differ from the actuality.

For the convenience of explanation, a "method for manufacturing an electronic component package" will be described first, followed by a description of an "electronic component package".

Manufacturing Method According to Present Disclosure

First, a method for manufacturing an electronic component package according to the present disclosure will be described. FIGS. 1A to 1G and FIGS. 2A to 2C schematically illustrate processes associated with the manufacturing method according to the present disclosure. In the manufacturing method according to the present disclosure, step (i) is performed first. That is, an electronic component 20 and a metal member 30 are disposed on an adhesive carrier 10 such that the electronic component 20 and the metal member 30 are attached onto the adhesive carrier 10 (see FIGS. 1A and 1B).

Figure 1A:
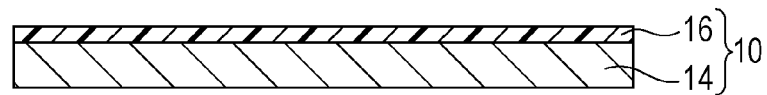
FIG. 1A is a cross-sectional process drawing schematically illustrating a method for manufacturing an electronic component package according to the present disclosure.

The adhesive carrier 10 is a component having adhesiveness and capable of supporting an electronic component and a metal member. The adhesive carrier 10 used may be any component that has "adhesiveness" and enables the peeling process performed later. For example, the adhesive carrier 10 may be a carrier sheet made up of a substrate and an adhesive layer. That is, as illustrated in FIG. 1A, the adhesive carrier 10 used may be a carrier sheet with a two-layer structure including an adhesive layer 16 disposed on a support base 14. In view of the release process performed later, the support base 14 may have flexibility.

The support base 14 of the adhesive carrier 10 may be any suitable sheet-like base that does not pose problems for processes performed later, such as "disposing of a metal member and an electronic component" and "formation of a sealing resin layer". For example, the material of the support base 14 may be resin, metal, and/or ceramic. Examples of the resin for the support base 14 may include polyester resin such as polyethylene terephthalate or polyethylene naphthalate, acrylic resin such as polymethyl methacrylate, polycycloolefin, and polycarbonate. Examples of the metal for the support base 14 may include iron, copper, aluminum, and their alloy. In one illustrative example, the metal for the support base 14 may be a stainless material such as SUS. Examples of the ceramic for the support base 14 may include apatite, alumina, silica, silicon carbide, silicon nitride, and boron carbide. The thickness of the support base itself may be in the range of 0.1 mm to 2.0 mm, or may be in the range of 0.2 mm to 1.0 mm (e.g., 0.2 mm). The adhesive layer 16 of the adhesive carrier 10 is not particularly limited as long as the adhesive layer 16 has adhesiveness with respect to the metal member and the electronic component. For example, the adhesive layer may include at least one kind of adhesive material selected from the group consisting of acrylic resin-based adhesive, urethane resin-based adhesive, silicone resin-based adhesive, and epoxy resin adhesive. The thickness of the adhesive layer 16 may be in the range of 2 μm to 50 μm, or may be in the range of 5 μm to 20 μm (e.g., 10 μm). A two-sided adhesive tape may be used as the adhesive layer 16. The two-sided adhesive tape used may be, for example, a tape with a layer of an adhesive provided on both principal surfaces of a resin film layer such as a PET film.

The electronic component 20 is attached onto an area of the adhesive carrier 10 that does not overlap the metal member 30. The electronic component 20 disposed on the adhesive carrier 10 may be any kind of circuit component or circuit element used in the field of electronics packaging. Illustrative but non-limiting examples of such an electronic component include an IC (e.g., a control IC), an inductor, a semiconductor device (e.g., a metal oxide semiconductor field-effect transistor (MOSFET)), a capacitor, a power device, a light-emitting device (e.g., an LED), a chip resistor, a chip capacitor, a chip varistor, a chip thermistor, other chip laminate filters, and a connection terminal.

The electronic component 20 may be disposed such that an electrode 25 of the electronic component 20 is in contact with the adhesive carrier 10. This configuration allows the electrode 25 of the electronic component 20 to be exposed in the release process performed later.

Figure 1B:
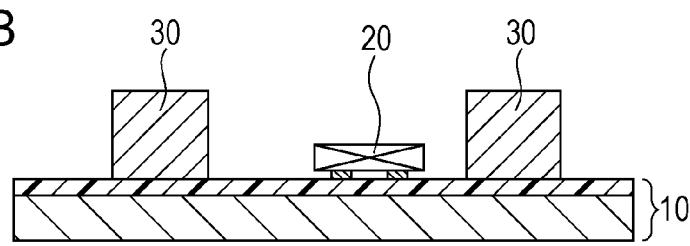
FIG. 1B is a cross-sectional process drawing schematically illustrating a method for manufacturing an electronic component package according to the present disclosure.

The metal member 30 disposed on the adhesive carrier 10 has a thickness greater than the thickness of the electronic component. That is, as illustrated in FIG. 1B, the metal member 30 having the form of a "metal block" as a whole is attached onto the adhesive carrier 10.

The term "thick metal member" as used herein refers to a member with a relatively large thickness such as a member in the form of a block, rather than a member with a relatively small thickness typically represented by a member in the form of a layer. In this regard, the "thick metal member" is not in the form of a patterned layer but is in lump/block form that will occupy a relatively large volume within the electronic component package. Furthermore, the "thick metal member" according to the present disclosure essentially serves to improve the transient heat characteristics and the ease of solder mounting in the second-level packaging process. In other words, the "thick metal member" is provided to allow for uniform melting of solder in the second-level packaging process, and as such, the "thick metal member" has a relatively large thickness.

The metal member 30 with a large thickness can be fabricated relatively easily. For example, the metal member 30 is obtained by punching out a metal material using a die.

The metal member 30 mentioned above may have a substantially rectangular parallelepiped or substantially cubic shape. That is, the metal member 30 may have the form of a "block" as a whole. As will be described later, the metal member 30 may be obtained from "multiple metal members integrally coupled to a frame-like member". Thus, the metal member 30 may have the form of multiple metal members 30 arranged in a frame-like shape.

The metal member 30 may be made of any material that contributes to improved transient heat characteristics. For example, the metal member 30 may be made of at least one kind of metal material selected from the group consisting of copper (Cu), aluminum (Al), silver (Ag), palladium (Pd), platinum (Pt), and nickel (Ni).

The metal member 30, which has a thickness greater than the thickness of the electronic component 20 as described above, may have a suitable thickness also in comparison with other members. For example, the thickness of the metal member 30 used in step (i) may be in the range of 50% to 90% of the thickness of a sealing resin layer 40 formed in step (ii) performed later. The thickness of the metal member 30 may be in the range of 60% to 90% of the thickness of the sealing resin layer 40. The metal member 30 with a thickness in the range of 70% to 90% of the thickness of the sealing resin layer 40 may be used in step (i). Seen from a different perspective, the thickness of the metal member 30 may be equal to or greater than half the thickness of the package, or may be in the range of, for example, about 55% to 85% of the package thickness. The metal member 30 with a thickness in the range of 65% to 85% of the package thickness may be used in step (i). Although the specific thickness of the metal member 30 may not be generalized as the thickness varies with the package being manufactured, the thickness of the metal member 30 may be in the range of, for example, 1 mm to 6 mm, or may be in the range of about 1.5 mm to 5.5 mm. That is, the metal member 30 may have a thickness of mm order.

As described above, the metal member 30 is provided with the particular intention of positively contributing to the transient heat characteristics in the second-level packaging process. Thus, in step (i), the electronic component 20 may be positioned inward relative to the metal member 30 (see FIG. 1B). That is, the metal member 30 may be disposed on the adhesive carrier 10 such that the metal member 30 is positioned outward of the electronic component 20.

The metal member 30 may be disposed on the adhesive carrier 10 in such a way that the metal member 30 is located on a dicing line in the dicing process performed later. This means that the metal member 30 will be positioned only in the peripheral portion of an electronic component package 100 that is finally obtained. Thus, the metal member 30 is disposed in such a way that the metal member 30 is "positioned only in the peripheral portion".

Figure 1C:
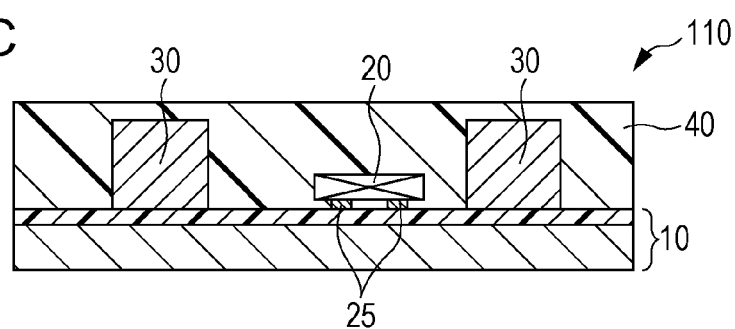
FIG. 1C is a cross-sectional process drawing schematically illustrating a method for manufacturing an electronic component package according to the present disclosure.

Step (ii) is performed following step (i). That is, as illustrated in FIG. 1C, the sealing resin layer 40 is formed on the adhesive carrier 10 so as to cover the electronic component 20 and the metal member 30, and an electronic component package precursor 110 is obtained as a result.

The sealing resin layer 40 can be provided by coating the adhesive surface of the adhesive carrier 10 with a raw resin material using a spin-coating process or a doctor-blade process, followed by application of processes such as heat treatment or photo-irradiation. In other words, the sealing resin layer 40 can be provided by subjecting the raw resin material coating to thermal curing or photo-curing. Alternatively, the sealing resin layer 40 may be provided by bonding a resin film onto the adhesive surface of the adhesive carrier 10 by another method. Further, the sealing resin layer 40 may be provided by filling a mold with uncured sealing resin in a powder or liquid form, followed by thermal curing of the sealing resin.

The sealing resin layer 40 may be made of any material that has insulating properties. For example, the material of the sealing resin layer 40 may be an epoxy-based resin or a silicone-based resin. The sealing resin layer 40 is generally required to be thicker than the electronic component 20 and the metal member 30. For example, the sealing resin layer 40 may be formed with a thickness greater than the thickness of the metal member 30 such that the thickness of the metal member 30 is in the range of 50% to 90% of the thickness of the sealing resin layer 40 as described above. The sealing resin layer 40 may be formed with a thickness greater than the thickness of the metal member 30 such that the thickness of the metal member 30 is in the range of 60% to 90% of the thickness of the sealing resin layer 40. The sealing resin layer 40 may be formed with a thickness greater than the thickness of the metal member 30 such that the thickness of the metal member 30 is in the range of 70% to 90% of the thickness of the sealing resin layer 40.

Figure 1D:
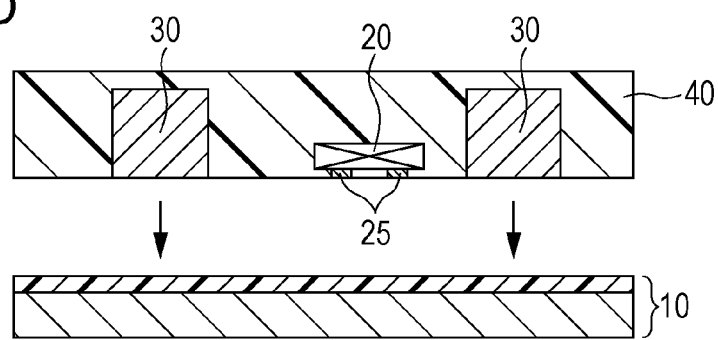
FIG. 1D is a cross-sectional process drawing schematically illustrating a method for manufacturing an electronic component package according to the present disclosure.

Step (iii) is performed following step (ii). That is, as illustrated in FIG. 1D, the adhesive carrier 10 is peeled off from the electronic component package precursor 110, thus leaving the electronic component 20 and the metal member 30 exposed from the surface of the sealing resin layer 40. In other words, the adhesive carrier 10 is removed so that the adhesive carrier 10 and the sealing resin layer 40 are separated from each other. This process allows the electronic component 20 and the metal member 30 to be exposed while being flush with the sealing resin layer 40.

In an alternative embodiment, in step (iii), the adhesive carrier 10 is peeled off from the electronic component package precursor 110 to leave the electrode 25 of the electronic component 20 exposed from the surface of the sealing resin layer 40, with a surface ("undersurface" in the arrangement depicted) of the metal member 30 exposed in an area outward of the area of the exposed electrode 25.

Step (iv) is performed following step (iii). That is, a metal layer 50 is formed on the surface of the sealing resin layer 40 (see FIGS. 1E and 1F). Specifically, the metal layer 50 is formed in contact with the exposed surface of each of the electronic component 20 and the metal member 30 (the surface exposed from the sealing resin layer 40).

Figure 1E:
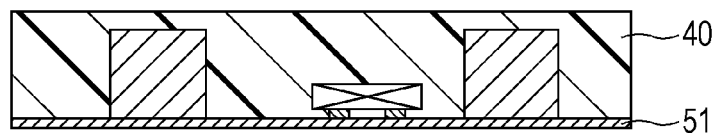
FIG. 1E is a cross-sectional process drawing schematically illustrating a method for manufacturing an electronic component package according to the present disclosure.
Figure 1F:
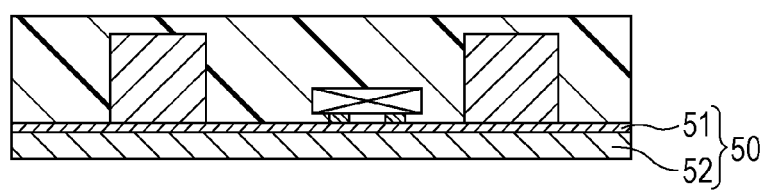
FIG. 1F is a cross-sectional process drawing schematically illustrating a method for manufacturing an electronic component package according to the present disclosure.

The metal layer 50 may be formed by dry plating and wet plating. More specifically, in step (iv), dry plating is performed first, and then wet plating is performed to form the metal layer 50. That is, a dry plating layer 51 may be formed by dry plating as illustrated in FIG. 1E, and then a wet plating layer 52 may be formed by wet plating as illustrated in FIG. 1F, thus forming the metal layer 50 with a two-layer structure including the dry plating layer 51 and the wet plating layer 52.

Examples of dry plating include physical vapor deposition (PVD), and chemical vapor deposition (CVD). Examples of physical vapor deposition (PVD) include sputtering, vacuum evaporation, and ion plating. Examples of wet plating include electroplating (e.g., electrolytic plating), chemical plating, and hot-dip plating. In the manufacturing method according to an aspect of the present disclosure, sputtering may be performed as dry plating, and electroplating (e.g., electrolytic plating) may be performed as wet plating.

By performing wet plating after dry plating, the "dry plating layer 51 with a relatively small average grain diameter" and the "wet plating layer 52 with a relatively large average grain diameter" can be formed. That is, an "under-layer with a relatively small average grain diameter" can be formed by dry plating, and then a "thick layer with a relatively large average grain diameter" can be formed by wet plating, thus allowing formation of the metal layer 50 made up of two layers with different average grain diameters. The term "grain diameter" as used herein refers to the value of grain diameter calculated based on a "cross-sectional image taken along the thickness of the metal layer". For example, the term "grain diameter" means the diameter of a circle having the same area as the area of a grain obtained from such a cross-sectional image, and the term "average grain diameter" means a value calculated as the number average of such grain diameters (e.g., the number average of 50 grains).

Characteristics of such a manufacturing process employing dry plating and wet plating include "forming the metal layer directly on the exposed surface of the metal member and the exposed surface of the electrode of the electronic component". This is because the "dry plating layer 51 serving as the under-layer for the wet plating layer 52 having a large thickness" can be provided as a very thin layer, and thus the wet plating layer 52 having a large thickness can be regarded as being in direct surface contact with the exposed surface of the electrode of the electronic component 20 and the exposed surface of the metal member 30. The metal layer 50 can be provided as a thick layer owing to the presence of the wet plating layer 52 having a large thickness, allowing the metal layer 50 to be used as, for example, a "heat dissipation member". In particular, from the manufacturing process perspective, it can be said that performing dry plating makes it possible to form the wet plating layer 52 with a large thickness and good adhesion by the wet plating process performed later.

The dry plating layer 51 may be formed with a thickness of 100 nm to 3000 nm by dry plating (see FIG. 1E), and then the wet plating layer 52 may be formed with a thickness of 18 μm to 500 μm by wet plating (see FIG. 1F). This allows the wet plating layer 52 to be formed with a large thickness as opposed to the very small thickness of the dry plating layer 51. As a result, the metal layer 50 can be formed with a large thickness as a whole.

The dry plating layer 51 formed by dry plating may include, for example, at least one kind of metal material selected from the group consisting of titanium (Ti), chromium (Cr), and nickel (Ni). The wet plating layer 52 formed by wet plating may include at least one kind of metal material selected from the group consisting of copper (Cu), nickel (Ni), and aluminum (Al).

In one illustrative but non-limiting example, the dry plating layer 51 may not necessarily be made up of a single layer but may be made up of multiple layers. For example, a Ti film layer and a Cu film layer may be formed as the dry plating layer 51 by sputtering. More specifically, the Cu film layer may be formed after the Ti film layer is formed. In this case, a thick Cu-plated layer may be formed as the wet plating layer 52 by electrolytic plating on such a sputtered layer having a two-layer structure.

Figure 1G:
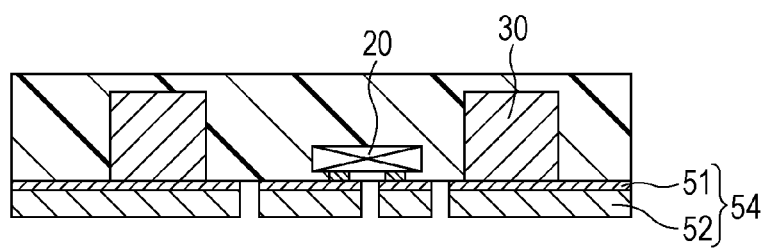
FIG. 1G is a cross-sectional process drawing schematically illustrating a method for manufacturing an electronic component package according to the present disclosure.

The metal layer 50 may be subjected to patterning. That is, the metal layer 50 with the two-layer structure of the dry plating layer 51 and the wet plating layer 52 may be subjected to patterning to form a metal pattern layer 54 (see FIG. 1G). Specifically, the metal layer 50 is subjected to patterning to form, for example, "metal pattern layer in contact with the exposed surface of the electrode of the electronic component 20" and "metal pattern layer in contact with the exposed surface of the metal member 30" as illustrated in FIG. 1G. This means desired wiring (e.g., a desired wiring pattern including an extraction electrode) can be formed by patterning. In one aspect of the present disclosure, the metal layer 50 is patterned such that the metal pattern layer 54 is disposed in the peripheral portion of the electronic component package (e.g., in the peripheral portion of the sealing resin layer; in one illustrative example, only in such a peripheral portion). This patterning itself is not particularly limited as long as the patterning is performed by a process used in the field of electronics packaging. For example, desired patterning may be performed by using photolithography including processes such as resist formation, exposure/development, and etching.

Figure 2A:
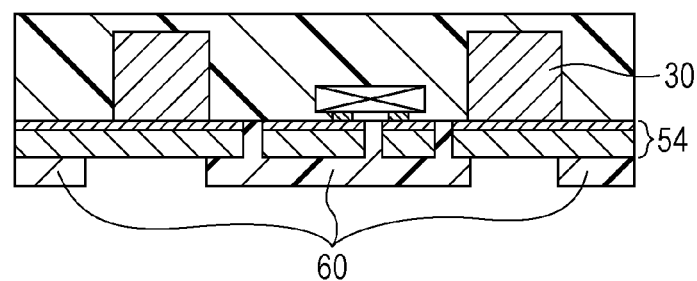
FIG. 2A is a cross-sectional process drawing schematically illustrating a method for manufacturing an electronic component package according to the present disclosure.

After the patterning of the metal layer, a resist layer 60, which is an insulating film, may be formed on the metal pattern layer 54 that has been patterned. For example, as illustrated in FIG. 2A, the resist layer 60 as a solder resist layer may be formed on the surface of the sealing resin layer (the surface exposed after the adhesive carrier is peeled off) such that the resist layer 60 covers at least a portion of the metal pattern layer 54. The resist layer 60 may be formed in a manner similar to the manner in which a solder resist is typically formed in the field of electronics packaging.

Dicing is performed after the formation of the metal layer and after, for example, the formation of the metal pattern layer 54 or the formation of the resist layer 60. That is, cutting is performed to obtain a desired electronic component package.

Figure 2B:
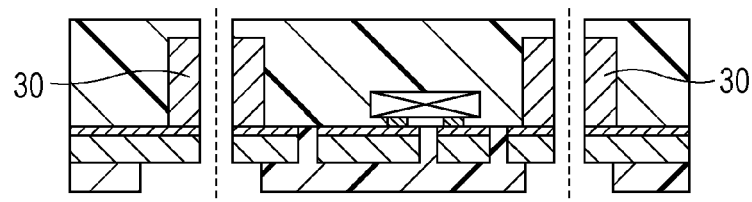
FIG. 2B is a cross-sectional process drawing schematically illustrating a method for manufacturing an electronic component package according to the present disclosure.
Figure 2C:
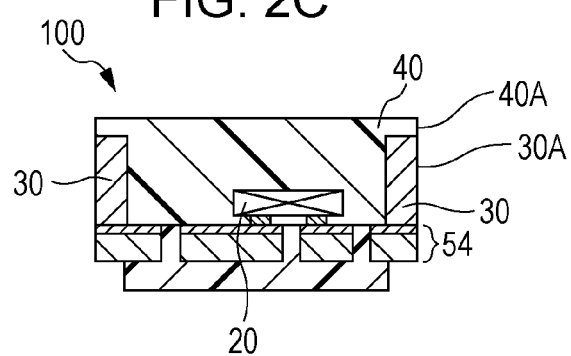
FIG. 2C is a cross-sectional process drawing schematically illustrating a method for manufacturing an electronic component package according to the present disclosure.

In the manufacturing method according to the present disclosure, dicing is performed such that the metal member 30 is split in two (see FIG. 2B). For example, dicing is performed such that the metal member 30 is split in half. As a result of such a dicing process, the electronic component package 100 with the metal member 30 disposed only in the peripheral portion of the package can be finally obtained (see FIG. 2C). That is, the "electronic component package 100 including the metal member 30 that is thicker than the electronic component 20 and is provided only in the peripheral portion of the sealing resin layer 40" can be obtained.

In particular, the dicing process performed in such a way as to split the metal member in two makes it possible to obtain the electronic component package 100 with a side face 30A of the metal member 30 exposed from an end face 40A of the sealing resin layer 40. In this case, for example, it is possible to obtain the electronic component package 100 in which the exposed side face 30A of the metal member 30 and the end face 40A of the sealing resin layer 40 are flush with each other.

Dicing may be performed by using any commonly employed method. In particular, the dicing member to be used is not particularly limited as long as the dicing member is capable of splitting the metal member in two. In one illustrative but non-limiting example, dicing may be performed using a dicing member such as a dicing blade, a dicing saw, or a laser.

If multiple metal members 30 are used in step (i), dicing may be performed such that all of the metal members 30 are individually split in two.

The manufacturing method according to the present disclosure may be implemented in various forms of processes. Such various implementations will be described below.

Manufacturing of Electronic Component Package Including Multiple Metal Members

According to the present disclosure, the electronic component package 100 including multiple metal members 30 may be manufactured. In particular, the "electronic component package 100 with multiple metal members 30 positioned only in the peripheral portion of the sealing resin layer 40" may be manufactured.

In such a manufacturing process, multiple metal members 30 are disposed on the adhesive carrier 10 in step (i), and all of the metal members 30 are individually split in two in the dicing process performed after step (iv). More specifically, in step (i), multiple metal members 30 are disposed such that all of the metal members 30 are located outward of the electronic component 20, and in the dicing process, cutting is performed such that all of the metal members 30 disposed in this way are individually split in two. For example, if multiple metal members 30 are disposed in a frame-like shape as a whole in step (i), the dicing process is performed such that all of the metal members 30 disposed in a frame-like shape are individually split in two. As a result of such a dicing process, an "electronic component package with multiple metal members arranged in a frame-like shape as a whole" can be finally obtained.

Figure 3:
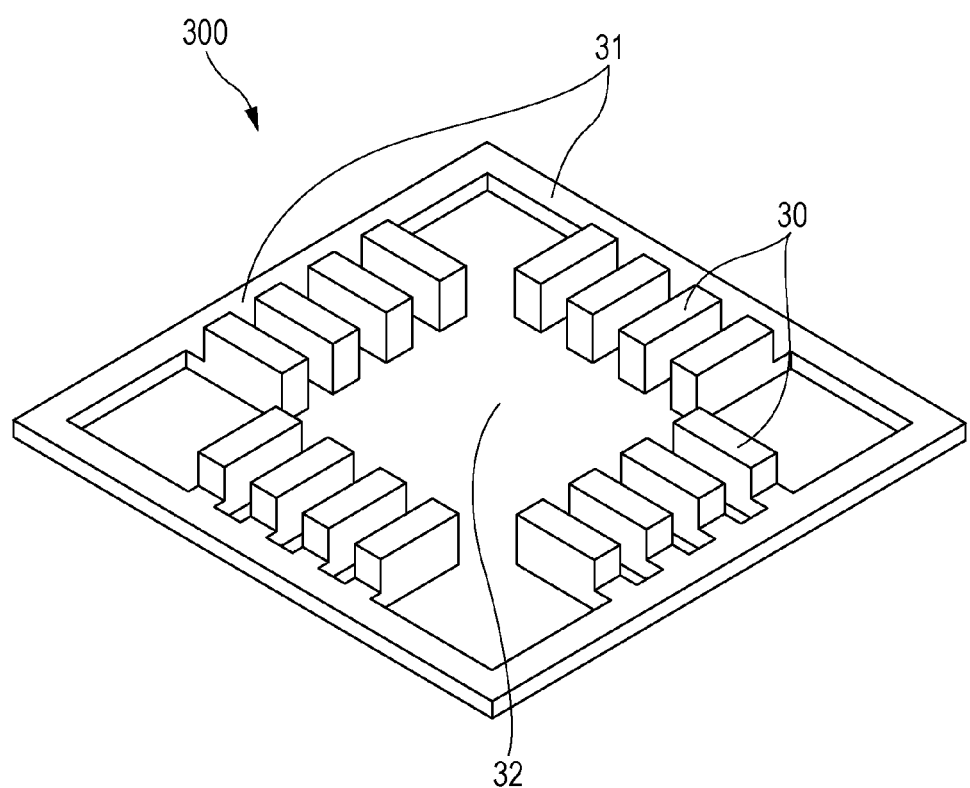
FIG. 3 is a schematic perspective view of multiple metal members integrally coupled to a frame-like member.
Figure 4A:
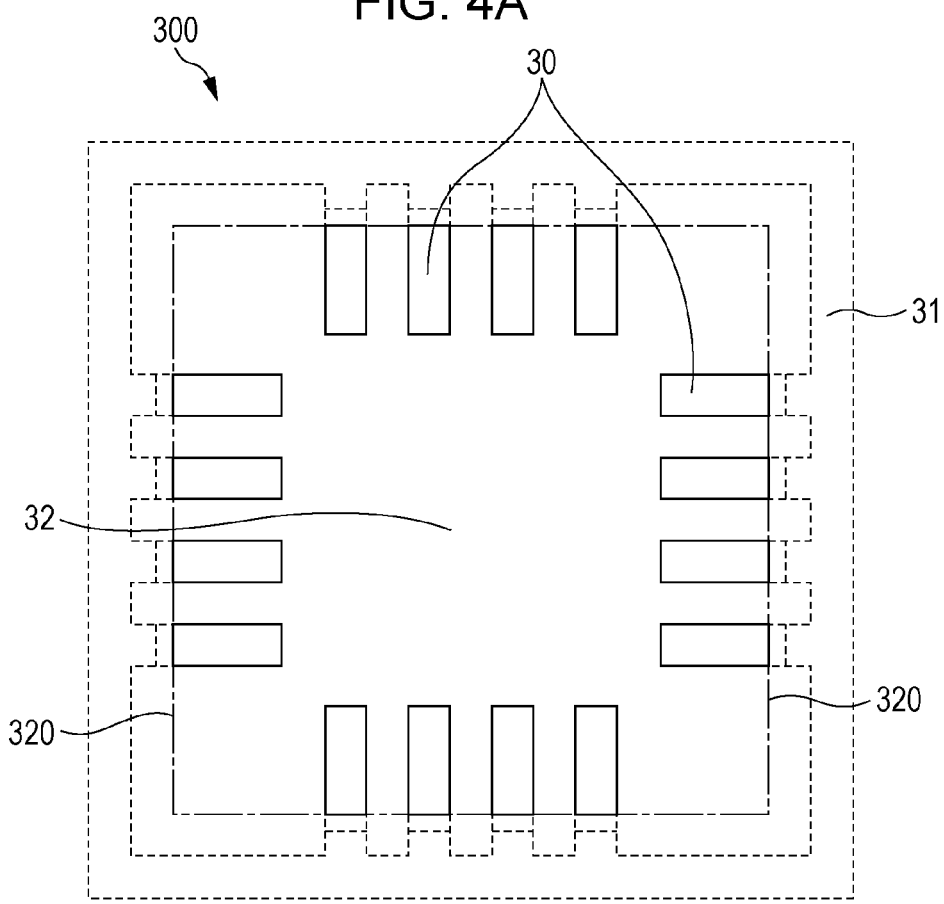
FIG. 4A is a schematic plan view for explaining a dicing process performed when the metal members illustrated in FIG. 3 are used.
Figure 4B:
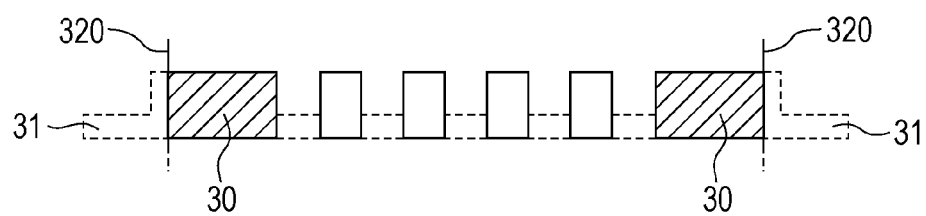
FIG. 4B is a schematic plan view for explaining a dicing process performed when the metal members illustrated in FIG. 3 are used.

As such multiple metal members 30, a metal member 300 as illustrated in FIG. 3 may be used. That is, as illustrated in FIG. 3, the metal member 300 in the form of multiple metal members 30 integrally coupled to a frame-like member 31 may be used in step (i). The metal member 300 described above is disposed on the adhesive carrier 10 in step (i), and in the dicing process performed after step (iv), all of the metal members 30 are individually split in two along a dicing line 320 (see FIGS. 4A and 4B). As a result, an "electronic component package with multiple metal members arranged in a frame-like shape as a whole" can be finally obtained.

The metal member 300 mentioned above can be obtained relatively easily by punching out a metal member with a die. In the metal member 300 mentioned above, each of the metal members 30 itself may have the same configuration as mentioned above. That is, each of the metal members 30 in the metal member 300 may have a substantially rectangular parallelepiped or substantially cubic shape. This means that in step (i), the electronic component 20 is disposed on the adhesive carrier 10 such that the electronic component 20 is located in the area inside the metal member 300. That is, the electronic component 20 is positioned in an area 32 illustrated in FIG. 3.

The frame-like member 31 may have a rectangular or square shape as a whole. Since the frame-like member 31 has a "frame-like" configuration, the area 32 inside the frame-like member 31 is hollow. Since the electronic component is positioned in the hollow area 32, it can be said that the metal member 300 is a member having the area 32 where the electronic component is to be placed. The metal members 30 are coupled to portions of the frame-like member 31 corresponding to its "rectangular" or "square" sides. As can be appreciated from the arrangement depicted, the metal members 30 of the metal member 300 may be positioned/placed in a symmetrical relationship as a whole.

Use of the metal member 300 as illustrated in FIG. 3 allows multiple metal members 30 to be disposed on the adhesive carrier 10 in step (i) with no displacement between the metal members 30. Use of the metal member 300 also makes it possible to prevent displacement from occurring in the subsequent processes such as steps (ii) to (iv) and the dicing process. Specifically, even if an accidental, unintended force is exerted on the metal members 30 after their placement on the adhesive carrier 10, the metal members 30 are able to keep their initial position with no displacement between the metal members 30. For example, even if stress is generated in the interior of resin owing to processes such as the curing of resin at the time of forming the sealing resin layer, the metal members 30 can be maintained in their position.

As can be appreciated from FIG. 3, multiple metal members 30 and the frame-like member 31 of the metal member 300 may be coupled to each other such that the metal members 30 are positioned inward of the frame-like member 31. In that case, dicing is performed at a position that is inside the frame-like member 31 and where each of the metal members 30 is to be split in two. Such a dicing process removes the frame-like member 31, thus providing a desired electronic component package 100 including multiple metal members 30.

Manufacturing of Multiple Electronic Component Packages at Once

The manufacturing method according to the present disclosure allows multiple electronic component packages to be manufactured at once. Specifically, an integrated member is used to obtain multiple electronic component packages at once. This integrated member includes, as the metal member 30 used in step (i), a number of metal members corresponding to multiple electronic component packages.

Figure 5:
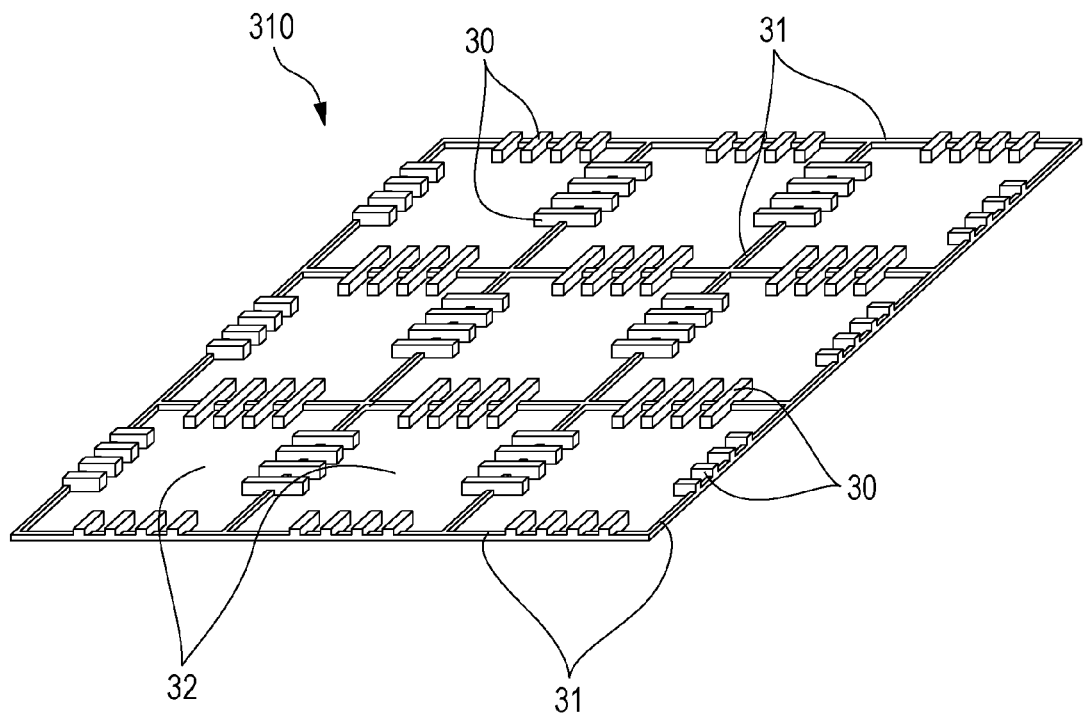
FIG. 5 is a schematic perspective view of an integrated member.

For example, an integrated member 310 as illustrated in FIG. 5 may be used. As illustrated in FIG. 5, the integrated member 310 is in the form of an integrated combination of multiple metal members 300 each corresponding to the metal member 300 illustrated in FIG. 3. The integrated member 310 is disposed on the adhesive carrier 10 in step (i), and in the dicing process performed after step (iv), all of the metal members 30 are individually split in two. This allows multiple "electronic component packages each including multiple metal members" to be manufactured at once.

The integrated member 310 mentioned above can be also obtained relatively easily by punching out a metal member with a die. Since the electronic component 20 is thus disposed on the adhesive carrier 10 such that the electronic component 20 is positioned in the area 32 inside the metal member 30 in step (i), the dicing line is located at a position inside the frame-like member 31 and where each of the metal members 30 is to be split in two. Such a dicing process removes the frame-like member 31, thus allowing multiple "electronic component packages each including multiple metal members" to be obtained at once.

This will be described in more detail below. In step (i), the integrated member 310 is disposed on the adhesive carrier 10. At this time, each of "electronic components 20 used for the corresponding one of multiple electronic component packages" is disposed such that the electronic component 20 is positioned in each of multiple electronic-component placement areas each corresponding to the area inside each individual frame-like member of the integrated member 310. This allows an "electronic component package precursor with multiple electronic component package precursors 110 integrated together" to be obtained at once after step (ii). Thus, multiple electronic component packages are finally obtained when dicing is performed after the peeling process. That is, dicing the integrated member 310 such that the integrated member 310 is broken into discrete pieces after step (v) makes it possible to obtain multiple electronic component packages at once.

Formation of Solder Joint

Figure 6A:
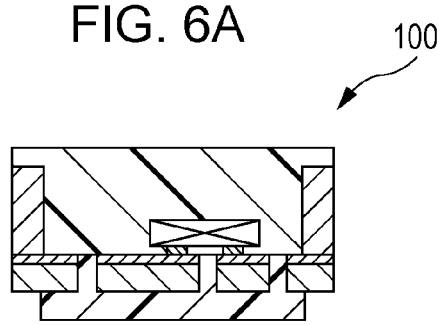
FIG. 6A is a cross-sectional process drawing schematically illustrating "formation of a solder joint"
Figure 6B:
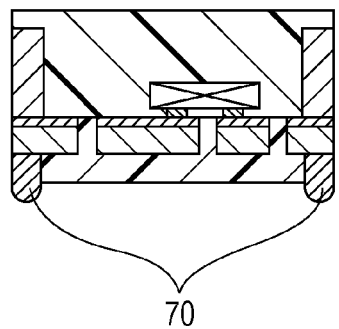
FIG. 6B is a cross-sectional process drawing schematically illustrating "formation of a solder joint"

The manufacturing method according to the present disclosure may additionally include formation of a solder joint. Specifically, as illustrated in FIGS. 6A and 6B, a "solder joint 70 used for connecting to a substrate on which the electronic component package is to be mounted" may be formed after the dicing process. The term "substrate" as used herein refers to a second-level substrate, which is, for example, a printed circuit board (printed wiring board).

The solder joint 70 may be formed in contact with at least, for example, the metal pattern layer 54. In the manufacturing method according to the present disclosure, the solder joint 70 may be formed only in the peripheral area of the principal surface of the electronic component package. That is, although the solder joint 70 is provided in an area in the periphery of or near the edges of the principal surface of the electronic component package (the lower surface of the package in the depicted arrangement), the solder joint 70 is not provided in the area of the principal surface of the package located inward of such an area.

This has to do with the fact that the transient heat characteristics in the second-level packaging process can be adjusted by the metal member 30 according to the present disclosure. If the solder joint 70 is provided only in an area in the periphery or near the edges of the principal surface of the electronic component package, the state of solder connection can be visually checked easily from the outside after the second-level packaging process. According to the present disclosure, the presence of the metal member 30 allows for improved transient heat characteristics in the second-level packaging process. More specifically, the presence of the metal member 30 allows the heat in the second-level packaging process to be transmitted in the lateral direction of or toward the outer side of the package. This allows desired melting of solder to be achieved even if the solder joint 70 is provided only in the area in the periphery of or near the edges of the principal surface of the electronic component package.

Electronic Component Package According to Present Disclosure

Next, an electronic component package according to the present disclosure will be described. The electronic component package according to the present disclosure is a package obtained by the manufacturing method according to the present disclosure mentioned above.

Figure 7:
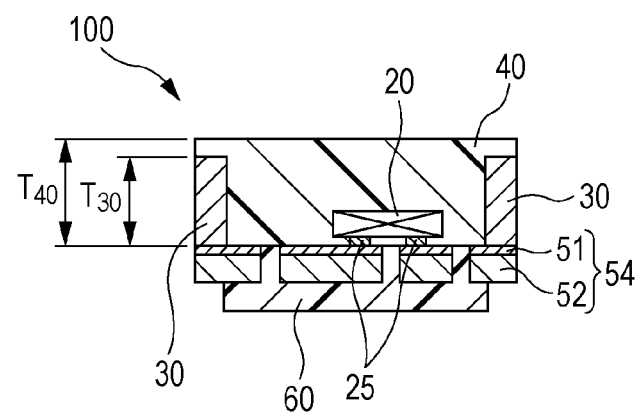
FIG. 7 is a cross-sectional view schematically illustrating the configuration of an electronic component package according to the present disclosure.

FIG. 7 schematically illustrates the configuration of the electronic component package according to the present disclosure. As illustrated in FIG. 7, the electronic component package 100 includes at least one electronic component 20, the metal member 30, and the sealing resin layer 40.

The electronic component 20 and the metal member 30 are buried in the sealing resin layer 40. As can be appreciated from FIG. 7, in one aspect of the present disclosure, the electronic component 20 and the metal member 30 may be buried in the sealing resin layer 40 while being flush with the sealing resin layer 40. That is, the "surface of the electronic component 20" and the "surface of the sealing resin layer 40" may be in substantially the same plane, and the "surface of metal member 30" and the "surface of the sealing resin layer 40" may be in substantially the same plane. As for the electronic component 20, the electrode 25 of the electronic component may be flush with the sealing resin layer 40. That is, the surface of the electrode 25 of the electronic component and the surface of the sealing resin layer 40 may be in substantially the same plane.

In the electronic component package 100 according to the present disclosure, the thickness of the metal member 30 is greater than the thickness of the electronic component 20. Further, the metal member 30 is provided only in the peripheral portion of the electronic component package 100. That is, as illustrated in FIG. 7, the metal member 30, which is thicker than the electronic component 20, is provided only in the peripheral portion of the sealing resin layer 40.

The metal member 30, which has a thickness greater than the thickness of the electronic component 20, may have a suitable thickness also in comparison with other members. For example, the thickness $T_{30}$ of the metal member 30 may be in the range of 50% to 90% of the thickness $T_{40}$ of the sealing resin layer 40 (see FIG. 7). The thickness $T_{30}$ of the metal member 30 may be in the range of 60% to 90% of the thickness $T_{40}$ of the sealing resin layer 40, or the thickness $T_{30}$ of the metal member 30 may be in the range of 70% to 90% of the thickness $T_{40}$ of the sealing resin layer 40. Seen from a different perspective, the thickness of the metal member 30 is equal to or greater than half the package thickness. For example, the thickness of the metal member 30 may be in the range of 55% to 85% of the package thickness, or the thickness of the metal member 30 may be in the range of 65% to 85% of the package thickness. Although the specific thickness of the metal member 30 may not be generalized as the thickness varies with factors such as the specific application intended for the package, the thickness of the metal member 30 may be, for example, 1 mm to 6 mm, or may be about 1.5 mm to 5.5 mm. That is, the metal member 30 may have a thickness of mm order.

As illustrated in FIG. 7, the electronic component package 100 according to the present disclosure may further have the metal pattern layer 54 electrically connected to the electronic component 20 and the metal member 30. In one aspect of the present disclosure, the metal pattern layer 54 is provided also in the peripheral portion of the electronic component package (e.g., the peripheral portion of the sealing resin layer).

Figure 8:
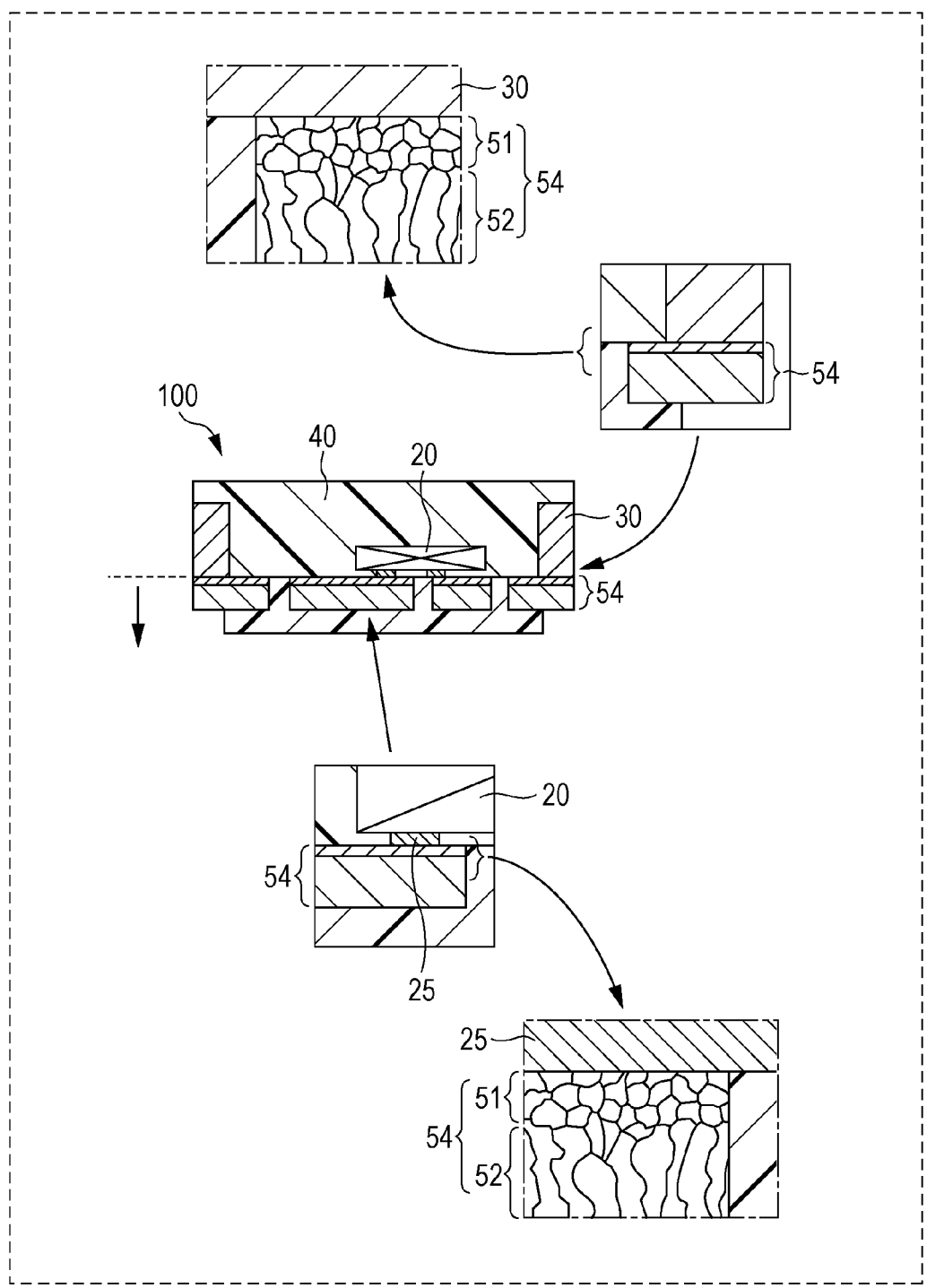
FIG. 8 is a cross-sectional view of an electronic component package for a more detailed explanation of a metal layer with a two-layer structure including a dry plating layer and a wet plating layer.

The metal pattern layer 54 may have at least a two-layer structure including the dry plating layer 51 and the wet plating layer 52. The dry plating layer 51 may correspond to a "layer with a relatively small average grain diameter", and the wet plating layer 52 may correspond to a "layer with a relatively large average grain diameter" (see FIG. 8). In the two-layer structure, the dry plating layer 51 is positioned relatively inward, and the wet plating layer 52 is positioned relatively outward.

More specifically, the dry plating layer 51 may be disposed such that the dry plating layer 51 is directly joined to the electronic component (in particular, the electrode 25 of the electronic component), with the wet plating layer 52 disposed on the dry plating layer 51. Likewise, the dry plating layer 51 may be disposed such that the dry plating layer 51 is directly joined to the metal member 30, with the wet plating layer 52 disposed on the dry plating layer 51. As can be appreciated from the above discussion, expressions such as "positioned relatively inward" as used herein mean being positioned closer to the "exposed surface of the metal member"/"exposed surface of the electrode of the electronic component", whereas expressions such as "positioned relatively outward" as used herein mean being positioned farther from the "exposed surface of the metal member"/"exposed surface of the electrode of the electronic component".

As for the specific average grain diameters of the dry plating layer 51 and the wet plating layer 52, the "average grain diameter of the dry plating layer 51" is greater than zero (excluding zero) and not greater than 2 µm, whereas the "average grain diameter of the wet plating layer 52" is in the range of 5 µm to 20 µm. The electronic component package according to the present disclosure may include a solder resist layer in the form of the resist layer 60 that covers at least a portion of the metal pattern layer 54 as illustrated in FIG. 7. The resist layer 60 may be formed in a manner similar to the manner in which a solder resist is typically formed in the field of electronics packaging.

In the electronic component package 100 according to the present disclosure, at least one electronic component 20 is buried in the sealing resin layer 40. Examples of such an electronic component include an IC (e.g., a control IC), an inductor, a semiconductor device (e.g., a metal oxide semiconductor field-effect transistor (MOSFET)), a capacitor, a power device, a light-emitting device (e.g., an LED), a chip resistor, a chip capacitor, a chip varistor, a chip thermistor, other chip laminate filters, and a connection terminal. In the present disclosure, the electrode 25 of the electronic component may be exposed from the surface of the sealing resin layer 40, with the metal pattern layer 54 disposed so as to be joined to the electrode 25 that is thus exposed.

The metal member 30, which is buried in the sealing resin layer 40, has a thickness greater than the thickness of the electronic component 20. That is, as illustrated in FIG. 7, the metal member 30 has the form of a "metal block" as a whole. This means that, as described above, the "metal member 30" has a relatively large thickness as in the case of a member in block form, rather than a member with a relatively small thickness typically represented by a member in layer form. That is, the "metal member" is not in the form of a patterned layer but is in lump/block form that will occupy a relatively large volume within the electronic component package.

The metal member 30 described above contributes to an improvement in transient heat characteristics and ease of solder mounting in the second-level packaging process, resulting in more uniform melting of solder in the second-level packaging process.

Figure 9A:
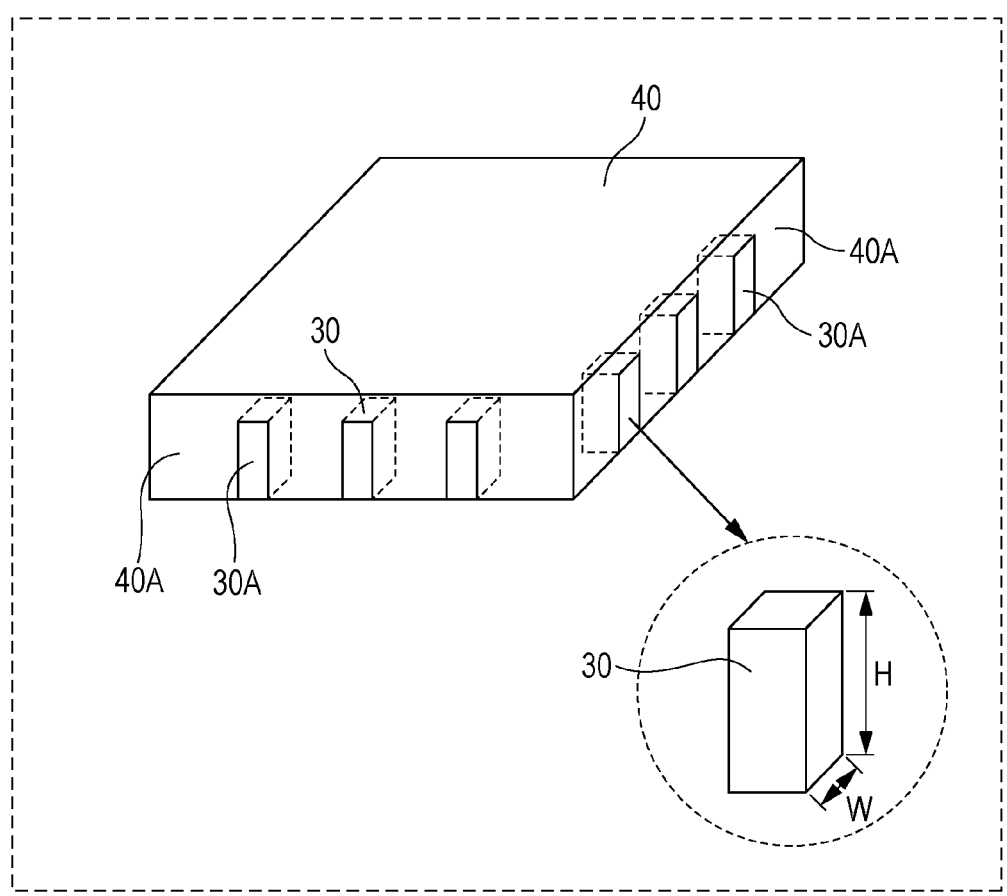
FIG. 9A is a schematic perspective view for explaining metal members disposed only in a "peripheral portion"

The metal member 30 buried in the sealing resin layer 40 may have a substantially rectangular parallelepiped or substantially cubic shape (see FIG. 9A). That is, the metal member 30 may have a "block" form as a whole. The ratio R (=H/W) of the height dimension H of the metal member 30 to the width dimension W, that is, the aspect ratio of the metal member 30, may be greater than 1, or may be in the range of about 1.2 to 10, or about 1.2 to 7, for example, about 1.5 to 5 (see FIG. 9A). The term "height dimension H" as used herein refers to the maximum dimension in the thickness direction (the thickness direction of the electronic component package, that is, the thickness direction of components such as the insulating resin layer and the electronic component), and the term "width dimension W" as used herein refers to the minimum dimension in a direction orthogonal to the thickness direction.

The metal member 30 includes, for example, at least one kind of material selected from the group consisting of copper (Cu), aluminum (Al), silver (Ag), palladium (Pd), platinum (Pt), and nickel (Ni). As a result, the metal member 30 contributes to improved transient heat characteristics in the second-level packaging process.

As described above, the metal member 30 is provided with the particular intention of positively contributing to the transient heat characteristics in the second-level packaging process. Thus, the metal member 30 is provided only in the peripheral portion of the sealing resin layer 40. The expression "provided only in the peripheral portion" means that although the metal member 30 is provided in an area near the edges of the electronic component package, the metal member 30 is not provided in the area inward of this area. The term "peripheral portion 420" as used herein refers to, for example, an area including edges 410 of the electronic component package and having, for example, a width equivalent to 10% of the longitudinal dimension M or lateral dimension N of the electronic component package (that is, the longitudinal dimension M or lateral dimension N of the sealing resin layer) as illustrated in FIG. 9B.

The side face 30A of the metal member 30 may be exposed from the end face 40A of the sealing resin layer 40 (see FIGS. 9A and 9B and FIGS. 10A and 10B). As illustrated in FIGS. 9A and 9B and FIGS. 10A and 10B, the exposed side face 30A of the metal member 30 and the end face 40A of the sealing resin layer 40 may be flush with each other.

The electronic component package 100 according to the present disclosure may include multiple metal members 30. In such a case, the metal members 30 may be positioned only in the peripheral portion of the electronic component package. That is, as illustrated in FIGS. 9A and 9B and FIGS. 10A and 10B, the side face 30A of each of the metal members 30 may be exposed from the end face 40A of the sealing resin layer 40. In this case as well, the exposed side face 30A of each of the metal members 30 and the end face 40A of the sealing resin layer 40 may be flush with each other.

Figure 9B:
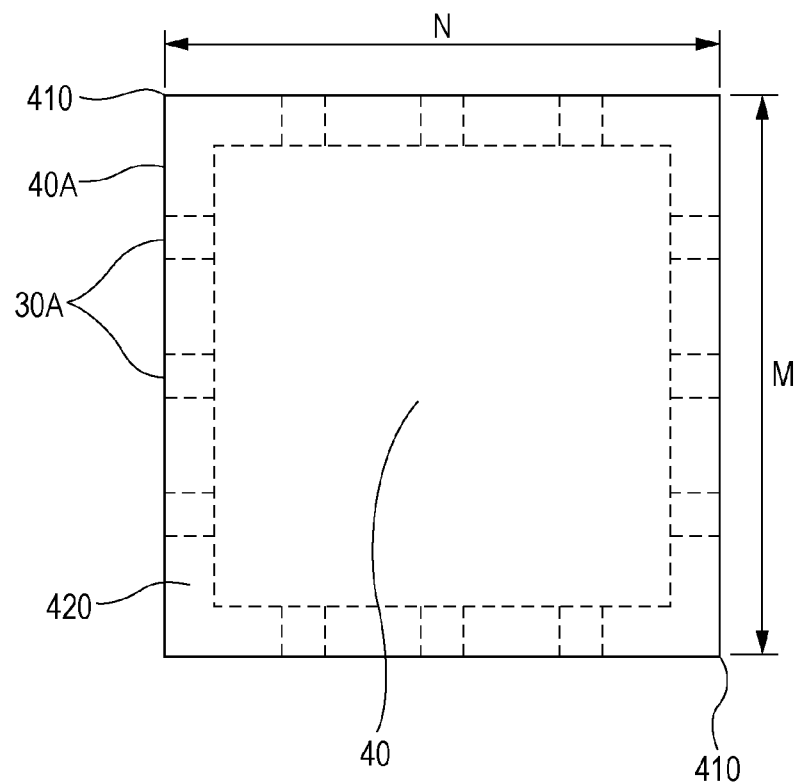
FIG. 9B is a schematic perspective view for explaining metal members disposed only in a "peripheral portion"
Figure 10A:
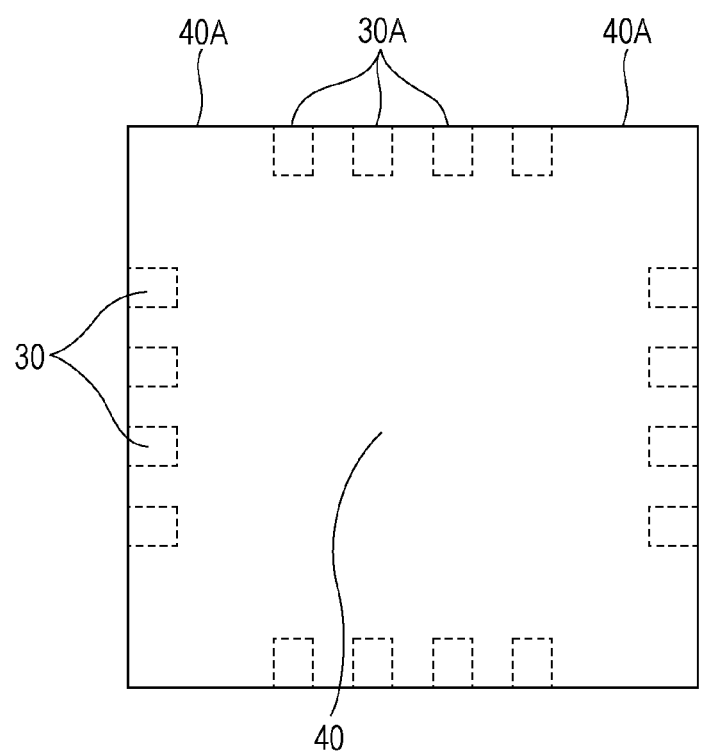
FIG. 10A is a schematic plan view for explaining metal members disposed only in a "peripheral portion"
Figure 10B:
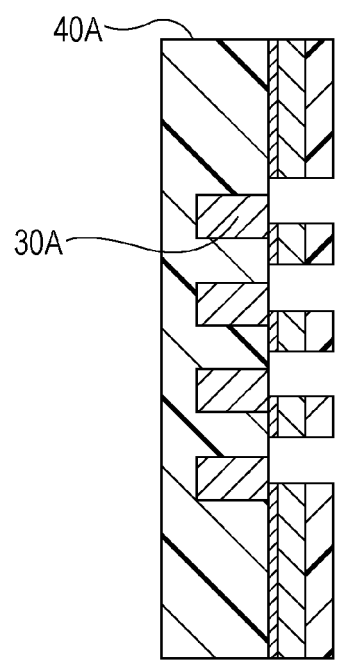
FIG. 10B is a schematic side view for explaining metal members disposed only in a "peripheral portion"
Figure 10C:
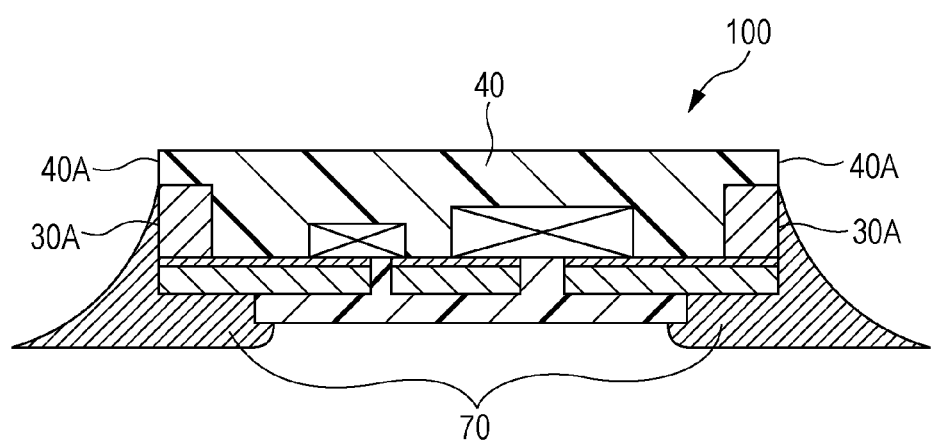
FIG. 10C is a schematic cross-sectional view for explaining metal members disposed only in a "peripheral portion" and a solder joint.

As can be appreciated from the arrangement depicted in FIGS. 9B and 10A, the metal members 30 may be arranged in a frame-like shape as a whole. In such a case, for example, the pitch of multiple metal members arranged in one direction may be constant. Arranging the metal members 30 in a frame-like shape as a whole allows for improved transient heat characteristics in the second-level packaging process and therefore more uniform melting of solder.

Figure 11:
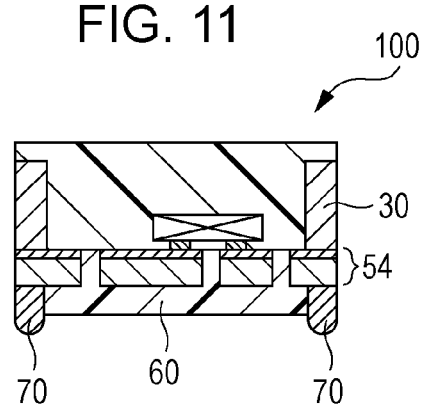
FIG. 11 is a cross-sectional view schematically illustrating the configuration of an electronic component package according to the present disclosure that further includes a solder joint.

As illustrated in FIG. 11, the electronic component package 100 may further include the solder joint 70 used for connecting to a substrate on which the electronic component package 100 is to be mounted. That is, for example, the electronic component package 100 may further include the solder joint 70 used for connecting to a second-level substrate such as a printed circuit board (printed wiring board).

The solder joint 70 may be provided at least in contact with the metal pattern layer 54. In one aspect of the present disclosure, the solder joint 70 described above is provided only in the peripheral area of the principal surface of the electronic component package. That is, although the solder joint 70 is provided in an area in the periphery of or near the edges of the principal surface of the electronic component package, the solder joint 70 is not provided in the area of the principal surface of the package located inward of such an area. According to the present disclosure, the presence of the metal member 30 allows for improved transient heat characteristics in the second-level packaging process. This allows melting of solder to be achieved even if the solder joint 70 is provided only in the area in the periphery of or near the edges of the principal surface of the electronic component package.

For example, the solder joint 70 described above may be provided as illustrated in FIG. 100. That is, the solder joint 70 may be positioned also near the end face of the sealing resin layer 40. More specifically, the solder joint 70 illustrated in FIG. 100 is positioned also near the end face 40A of the sealing resin layer 40 in such a way that the solder joint 70 is in contact with the side face 30A of the metal member 30 that is exposed from the end face 40A of the sealing resin layer 40. The solder joint 70 positioned in this way allows for improved transient heat characteristics in the second-level packaging process. Specifically, the heat in the second-level packaging process, that is, the transient heat is more readily transmitted in the lateral direction of or toward the outer side of the package.

The above-mentioned configuration allows more heat to be dissipated from a part of the metal pattern layer that is exposed from the resist layer, in an area below the metal member. This allows for increased heat dissipation.

Further, according to the above-mentioned configuration, the provision of the metal member allows for uniform distribution of heat in an area below the metal member. The uniform distribution of heat reduces "localized differences in the melting of solder" in an area below the metal member, which results from factors such as thermal capacity characteristics of components included in the electronic component package. Therefore, for the solder connection between a part of the metal pattern layer exposed from the resist layer, and the second-level substrate, "localized differences in the melting of solder" can be reduced to enable a desired solder connection.

The foregoing description of embodiments of the present disclosure is only illustrative of typical embodiments. Accordingly, those skilled in the art will readily appreciate that the present disclosure is not limited to these embodiments but various other embodiments are conceivable.

As is apparent from, for example, the arrangement depicted in FIG. 7, the metal member 30 according to the present disclosure is provided in the peripheral portion of the sealing resin layer, and exposed from areas such as the end face of the resin layer. As such, the metal member 30 can be regarded as an external terminal. In this case, the presence of the metal member, which is an external terminal with a large thermal capacity, allows for improved transient heat characteristics in the second-level packaging process.

In the manufacturing method according to the present disclosure, for example, the adhesive carrier that has been peeled off may be reused. That is, according to the present disclosure, an "adhesive carrier that has been used once" can be used in the manufacture of another electronic component package performed later.

What is claimed is:
1. An electronic component package comprising:
a metal pattern layer having a first principal surface, and a second principal surface opposite to the first principal surface;
an electronic component that is disposed on the first principal surface, and electrically connected to the metal pattern layer;
at least one metal member that is disposed on the first principal surface, and electrically connected to the metal pattern layer;
a sealing resin layer disposed on the first principal surface, the electronic component, and the at least one metal member; and
an insulating layer disposed on the second principal surface,
wherein the at least one metal member has a thickness greater than a thickness of the electronic component,
wherein in plan view, the at least one metal member is disposed on an area of the first principal surface, the area including an end of the first principal surface, wherein at least a part of the metal pattern layer is exposed from the insulating layer, the part located in an area below the at least one metal member, and wherein an outermost side surface of the insulating layer is radially inward of an outermost side surface of the at least one metal member.

2. The electronic component package according to claim 1, wherein the thickness of the at least one metal member is not less than 50% and not more than 90% of a thickness of the sealing resin layer.

3. The electronic component package according to claim 1, wherein the at least one metal member has a side face that is exposed from an end face of the sealing resin layer.

4. The electronic component package according to claim 3, wherein the side face of the at least one metal member and the end face of the sealing resin layer are flush with each other.

5. The electronic component package according to claim 1, wherein the at least one metal member comprises a first metal member and a second metal member, wherein in plan view, the first metal member is disposed on a first area of the first principal surface, the first area including a first end of the first principal surface, and wherein in plan view, the second metal member is disposed on a second area of the first principal surface, the second area including a second end of the first principal surface.

6. The electronic component package according to claim 5, wherein in plan view, the first metal member and the second metal member are disposed apart from each other.

7. The electronic component package according to claim 1, wherein the at least one metal member has a shape of a rectangular parallelepiped or a cube.

8. The electronic component package according to claim 1, wherein the metal pattern layer includes a first metal layer and a second metal layer.

9. The electronic component package according to claim 1, wherein the insulating layer is a solder resist layer.

* * * * *